(12) United States Patent
Mueller et al.

(10) Patent No.: US 8,304,806 B2
(45) Date of Patent: Nov. 6, 2012

(54) ESD AND EMC OPTIMIZED HV-MOS TRANSISTOR

(75) Inventors: Karl-heinz Mueller, Velden (DE); Kai Esmark, Neuried (DE)

(73) Assignee: Infineon Technologies AG, Neubiberg (DE)

( * ) Notice: Subject to any disclaimer, the term of this patent is extended or adjusted under 35 U.S.C. 154(b) by 332 days.

(21) Appl. No.: 12/815,232

(22) Filed: Jun. 14, 2010

(65) Prior Publication Data

US 2011/0303948 A1    Dec. 15, 2011

(51) Int. Cl.
*H01L 29/74* (2006.01)
*H01L 31/111* (2006.01)
*H01L 23/62* (2006.01)
*H02H 3/00* (2006.01)
*H02H 7/00* (2006.01)
*H02H 9/00* (2006.01)

(52) U.S. Cl. ............... 257/173; 257/355; 257/E23.114; 361/56

(58) Field of Classification Search ............... 257/173, 257/355, E23.114, E23.141; 361/56
See application file for complete search history.

(56) References Cited

U.S. PATENT DOCUMENTS

| | | | | |
|---|---|---|---|---|
| 5,546,038 A | * | 8/1996 | Croft | 327/310 |
| 6,078,204 A | * | 6/2000 | Cooper et al. | 327/309 |
| 6,329,691 B1 | * | 12/2001 | Finzi | 257/355 |

* cited by examiner

*Primary Examiner* — David S Blum
(74) *Attorney, Agent, or Firm* — Lee & Hayes, PLLC (57) ABSTRACT

Devices and circuits related to Electrostatic discharge (ESD) and Electromagnetic compatibility (EMC) are herein described. An ESD protection device is incorporated into a transistor in order to protect the gate of the transistor from excessive current loads related to ESD or EMC events. In an implementation, a device includes a first diode and a second diode that are electrically connected via their respective cathodes. The breakdown voltage of the first diode is lower than the breakdown voltage of the second diode in order to divert excessive current through the second diode.

20 Claims, 11 Drawing Sheets

ESD AND EMC OPTIMIZED HV-MOS TRANSISTOR

BACKGROUND

Electrostatic discharge (ESD) is a sudden and typically unintended increase in current caused by the introduction of an electrical charge that creates an electric potential that is greater than the operating voltage of a circuit. Damage to the materials that comprise the components of the circuits can occur if the current flow is excessive. ESD events can cause minor interruptions in circuit operations which are recoverable and do not cause permanent damage to the devices. But, if the current flow exceeds a materials capability to function as a dielectric or insulator and begins to conduct current freely, then unrecoverable damage may occur and render a circuit inoperative. Prevention of ESD damage may comprise charge dissipation techniques that include anti-static materials, grounding devices, deionizers, or fuses.

Electromagnetic interference (EMI) is a sudden increase in current in a transistor or circuit caused by the propagation of electromagnetic energy from a source in proximity to the transistor or circuit. Electromagnetic compatibility (EMC) is the study of various techniques to reduce or eliminate EMI by grounding or shielding susceptible transistors or circuits or suppressing EMI sources to minimize the impact on nearby transistor and circuits. For example, fuses, filters, or switches may be used to minimize the impact of EMI.

SUMMARY

This summary is provided to introduce simplified concepts of ESD and EMC protection devices and techniques for protecting components from high levels of voltage and current. The devices are described in greater detail below in the Detailed Description. This summary is not intended to identify essential features of the claimed subject matter, nor is it intended for use in determining the scope of the claimed subject matter.

Electrostatic discharge is a hazard likely to be encountered by any integrated circuit. ESD protection devices and techniques have far reaching applications ranging across many industries ranging from automotive, telecommunications, and computer-hardware to name a few.

In one embodiment, a circuit comprising a first diode and a second diode are connected to each other via their cathodes to form an ESD protection device. The first diode has a breakdown voltage that is higher than the breakdown voltage of the second diode. The second diode is configured to remain in a reversed bias state until the ESD protection device encounters a voltage that is higher than the breakdown voltage of the second diode. The operating voltage of the first diode is less than the breakdown voltage of the second diode. Hence, the first diode may operate as intended under operating conditions determined by the designer of the diode. But when the common cathode between the first and second diode experiences an ESD event, the increased current is routed through the second diode instead of the first diode due to the second diode having a lower breakdown voltage than the first diode. The excessive current flow is isolated from the first diode which prevents damage to the first diode that may render the diode inoperative.

In another embodiment, an electrostatic discharge protection device comprises a first electrical path and a second electrical path included in a substrate. A first portion of the first electrical path is electrically connected to a first portion of the second electrical path. The first electrical path has a breakdown voltage that is higher than the breakdown voltage of the second electrical path.

In another embodiment, a device comprises a first diode and a second diode. The first diode is formed by a first doped region and a second doped region that are adjacent to each other. The second diode is formed by the first doped region and the second doped region. The second diode has a breakdown voltage that is lower than the breakdown voltage of the first diode and the second diode is configured to restrict current flow unless the breakdown voltage of the second diode is exceeded.

In various alternative embodiments, including a first diode and a second diode, the breakdown voltage of the second diode may be made lower than the breakdown voltage of the second diode by adding additional doped regions in various arrangements in relationship to the second diode. These additional doped region embodiments will be discussed in greater detail below.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

DETAILED DESCRIPTION

Overview

Embodiments of devices and circuits related to ESD protection are described herein. ESD protection is applicable to any circuit or device that is configured to conduct an electric current or is exposed to potential differences and enables a circuit to remain operable if the circuit is experiences an ESD or EMI event.

A circuit comprising a first diode and a second diode are connected to each other via their cathodes to form an ESD protection device. The first diode has a breakdown voltage that is higher than the breakdown voltage of the second diode. The second diode is configured to remain in the reversed bias state until the ESD protection device encounters a voltage that is higher than the breakdown voltage of the second diode. The first diode may also be incorporated into a first transistor and the second diode may also be incorporated into a second transistor.

An electrostatic discharge protection device comprises a first electrical path and a second electrical path included in a substrate. A first portion of the first electrical path is electrically connected to a first portion of the second electrical path and a second portion of the first electrical path is electrically connected to a second portion of the second electrical path. The first electrical path has a breakdown voltage that is higher than the breakdown voltage of the second electrical path. The second electrical path is configured to restrict current flow unless the breakdown voltage of the second electrical path is exceeded. The first electrical path may also include a transistor and the second electrical path may also include a transistor.

In another embodiment, for purposes of explanation and not limitation, the transistors described above may include a variety of transistor types. For example, the first transistor may be a field effect transistor and the second transistor may be a bipolar junction transistor. Also, the transistors may be formed in the NPN or PNP configuration.

Another electrostatic protection device comprises a first diode and a second diode. The first diode is formed by a first doped region and a second doped region that are adjacent to each other. The first doped region includes a first dopant concentration and the second doped region includes a second dopant concentration. The second diode is formed by the first doped region and the second doped region. The second diode has a breakdown voltage that is lower than the breakdown voltage of the first diode and the second diode is configured to restrict current flow unless the breakdown voltage of the second diode is exceeded. The first diode is configured to alternate between a forward biased state and a reversed biased state while the second diode remains in the reversed biased state unless the breakdown voltage of the second diode is exceeded.

In another embodiment, a device comprises a first diode and a second diode formed between a first doped region and a second doped region. The breakdown voltage of the second diode is lower than the breakdown voltage of the first diode due to a third doped region comprising a third dopant concentration that is located adjacent to the second diode.

In another embodiment, a device comprises a first diode and a second diode formed between a first doped region and a second doped region. The breakdown voltage of the second diode is lower than the breakdown voltage of the first diode due to a third doped region comprising a third dopant concentration that is located adjacent to the second diode and including a fourth doped region comprising a fourth dopant concentration being configured to overlap a portion of the first doped region, the second doped region, and the third doped region.

In another embodiment, a device comprises a first diode and a second diode formed between a first doped region and a second doped region. The breakdown voltage of the second diode is lower than the breakdown voltage of the first diode due to a third doped region comprising a third dopant concentration that is located adjacent to the second diode and including a fourth doped region comprising a fourth dopant concentration being configured to overlap a portion of the first doped region and the second doped region.

In another embodiment, a device comprises a first diode and a second diode formed between a first doped region and a second doped region. The breakdown voltage of the second diode is lower than the breakdown voltage of the first diode due to a third doped region comprising a third dopant concentration that is located adjacent to the second diode and including a fourth doped region comprising a fourth dopant concentration being configured to overlap a portion of the second doped region.

In another embodiment, a device comprises a first diode and a second diode formed between a first doped region and a second doped region. The breakdown voltage of the second diode is lower than the breakdown voltage of the first diode due to a third doped region comprising a third dopant concentration that is located adjacent to the second diode and including a fourth doped region comprising a fourth dopant concentration located at an interface of the first doped region and the third doped region.

In yet another embodiment, a device comprises a first diode and a second diode formed between a first doped region and a second doped region. The breakdown voltage of the second diode is lower than the breakdown voltage of the first diode due to a third doped region comprising a third dopant concentration that is located adjacent to the second diode and including a fourth doped region comprising a fourth dopant concentration being configured to overlap a portion of the first doped region, the second doped region, and a fifth doped region.

ESD/EMC Protection Device

Figure 1:
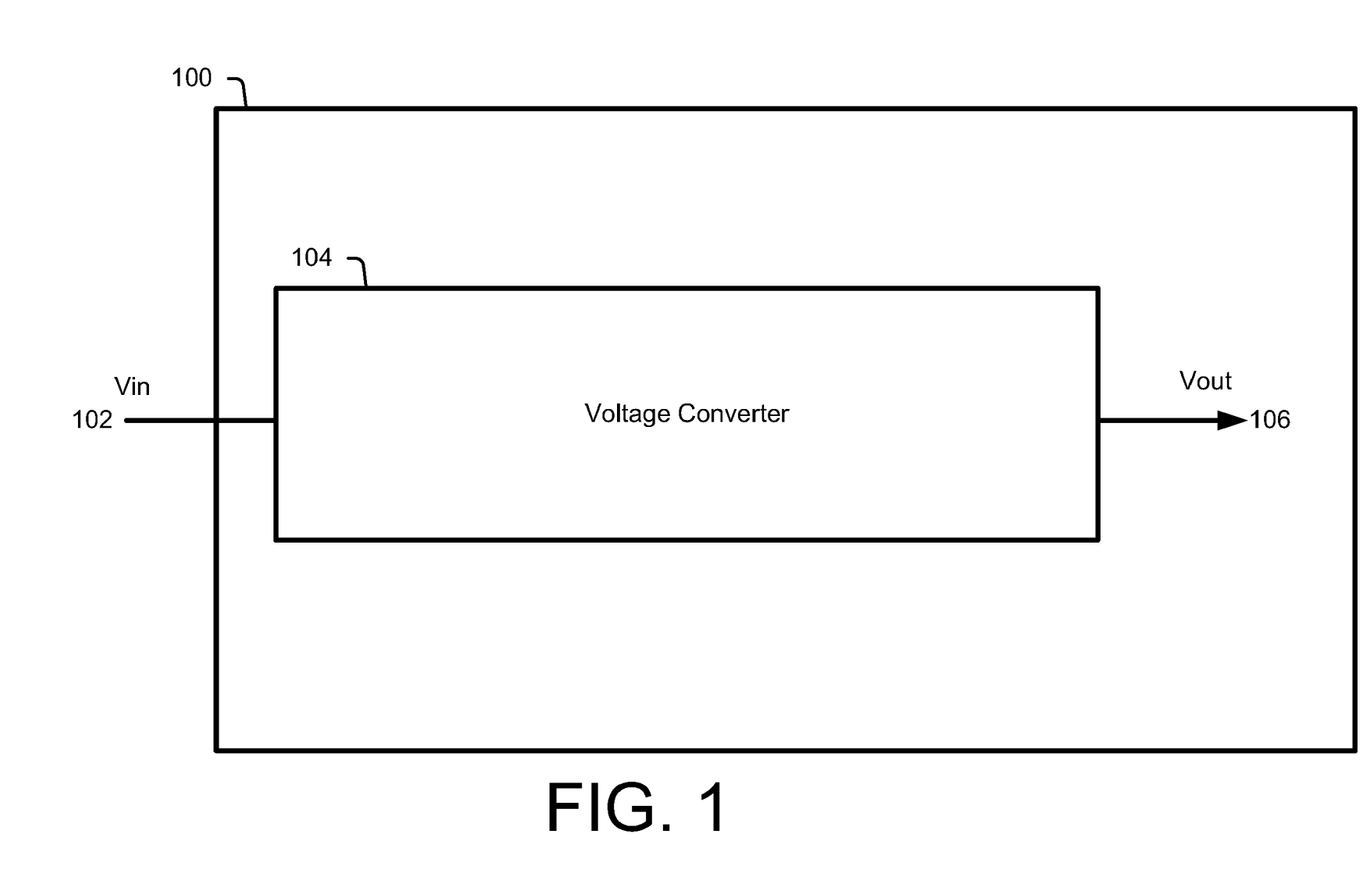
FIG. 1 shows a representative environment in which an ESD device may be placed.

FIG. 1 illustrates a representative environment in which an ESD protection device may be used. This implementation is meant to serve only as a non-limiting example of a suitable environment. An integrated circuit 100 includes a input voltage pin $V_{in}$ 102 that is connected to a voltage converter 104 that receives a high input voltage $V_{in}$ 102 and transforms the high input voltage to a lower output voltage $V_{out}$ 106 that is provided to other components within the integrated circuit 100. ESD or charge buildup near the pins of integrated circuits is particularly dangerous to the internal components of integrated circuits that may be operated at voltages that are significantly lower than even input voltage 102. Additionally, lower operating voltage components within an integrated circuit may also need protection from high input voltages.

Figure 2:
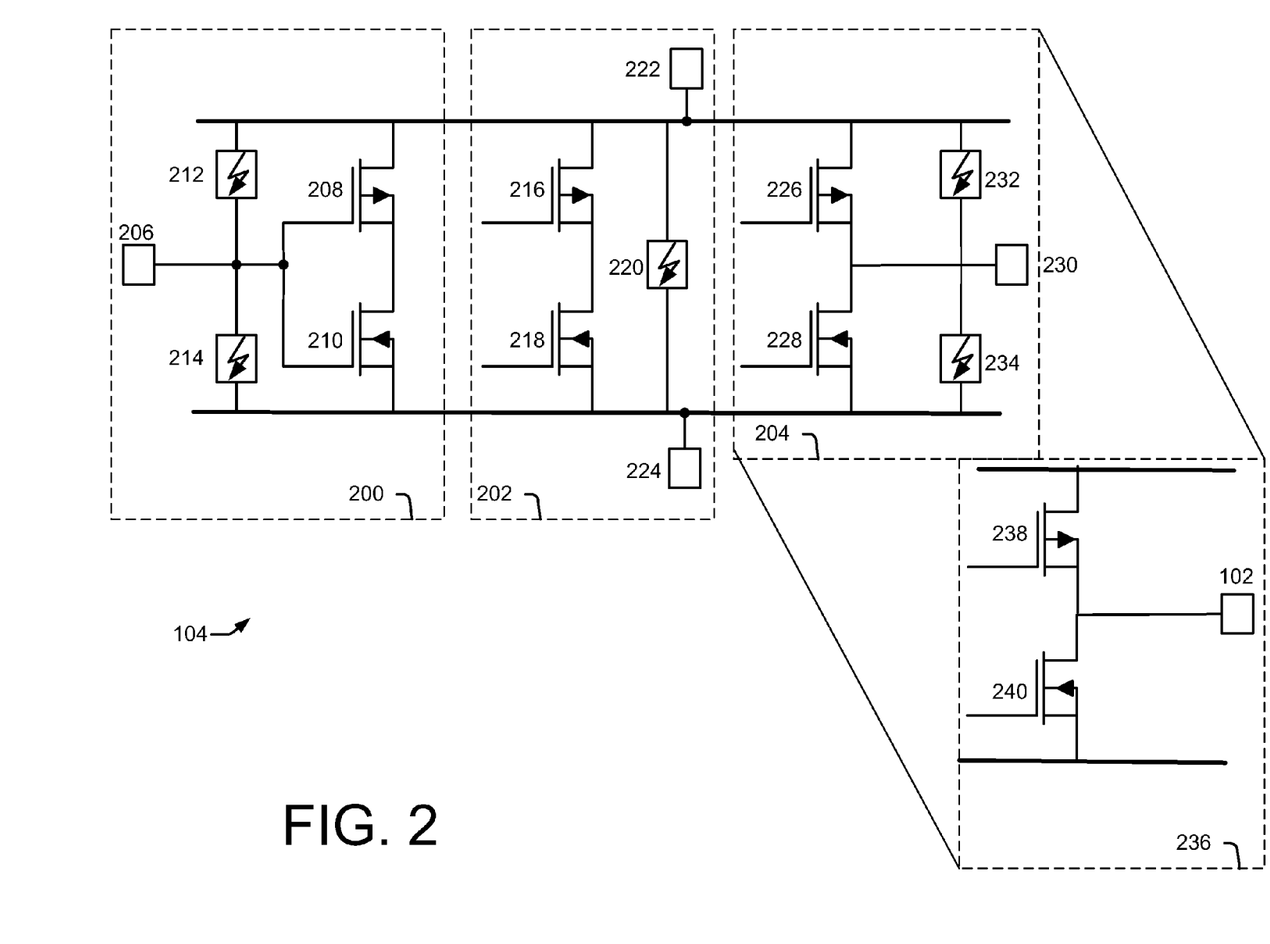
FIG. 2 shows a diagram of an ESD protection circuit according to one illustrative embodiment.

FIG. 2 illustrates an embodiment of an ESD protection scheme for an integrated circuit 100. By way of explanation and not limitation, the ESD protection scheme is incorporated into a voltage converter 104 that includes an input stage 200, a buffer stage 202, and an output stage 204. The input stage 200 includes an input terminal 206 and two driver transistors 208, 210. Two current shunt devices 212, 214 are also placed in parallel with the driver transistors 208, 210 and in between the input terminal 206 and the driver transistors 208, 210.

The buffer stage 202 also includes some additional circuitry represented here by way of example and not limitation as two transistors 216, 218 that are in parallel with a current shunt device 220. The buffer stage 202 may also include a drain voltage supply 222 and source voltage supply 224.

The output stage 204 also includes two output driver transistors 226, 228 connected to an output terminal 230. Also, two current shunt devices 232, 234 are connected in parallel with the output driver transistors 226, 228 and are placed to isolate the output terminal 230 from the driver transistors if an ESD event occurs. The current shunt devices 232, 234 will shunt excessive current away from the output terminal 230 if the current exceeds a predetermined threshold. In an alternative embodiment, the shunt threshold may be programmable. For example, the shunt devices may receive a reference voltage that adjusts the threshold that determines what level of current will be shunted away from the driver transistors 226, 228.

Another alternative embodiment is exemplified by a second output stage 236 that uses transistors 238, 240 to provide ESD protection instead of the current shunt devices 232, 234 shown in the first output stage. The second output stage 236 is intended to replace the output stage 204 as highlighted by the solid lines connecting to the upper right and lower left corners of the two stages.

Figure 3:
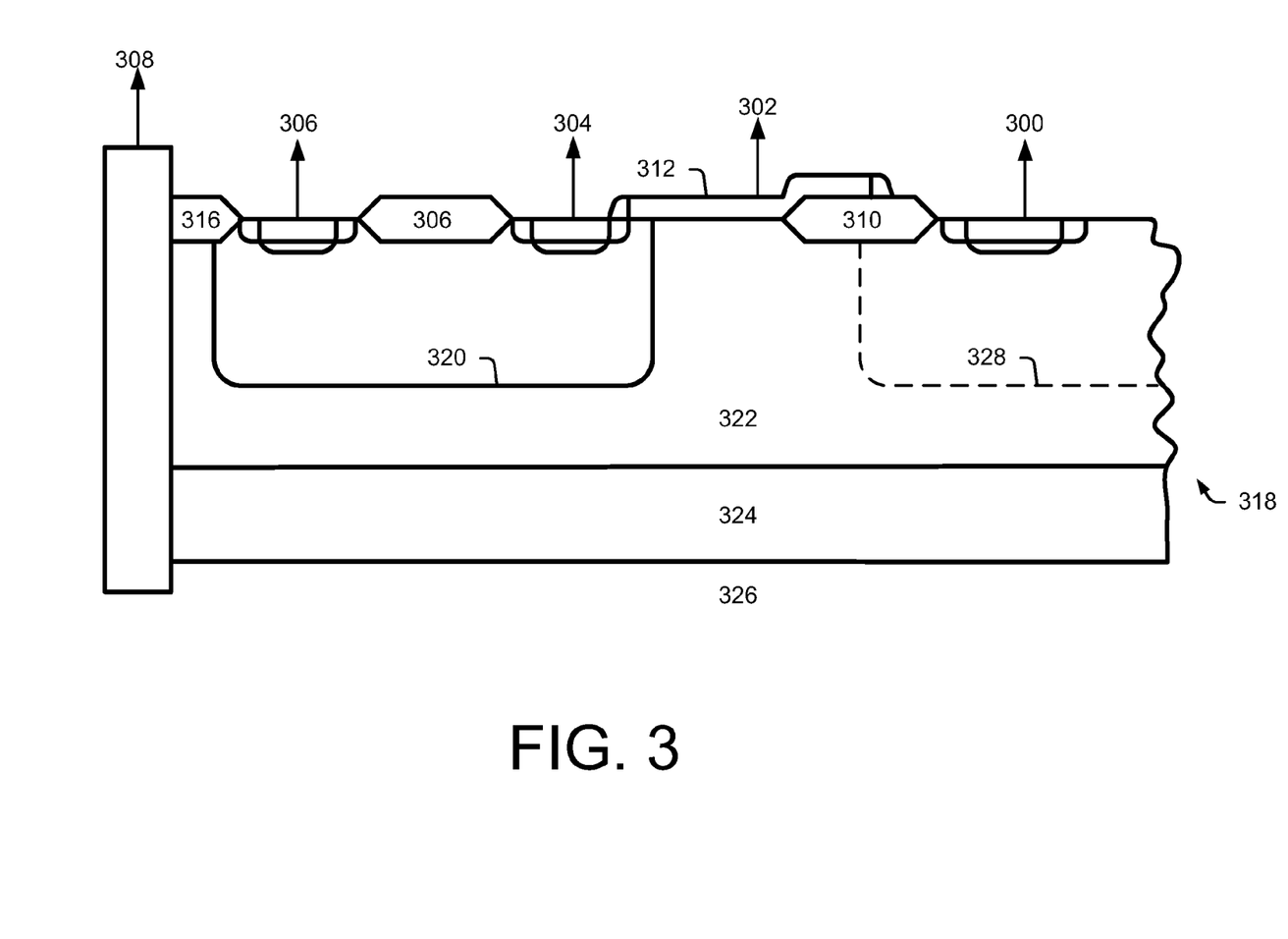
FIG. 3 shows a diagram of an illustrative ESD protection device usable in the circuit of FIG. 2.

FIG. 3 illustrates a diagram of a design for the transistor 240 shown in FIG. 2. The transistor 240 may be used as a transistor and as an ESD protection device. Transistor 240 may include a drain contact 300, a gate contact 302, a source contact 304, a well bulk contact 306, and a substrate contact 308. In this embodiment, the transistor 240 includes an extended drain isolation oxide 310 that extends from the drain contact 300 to underneath the gate 312. The source contact 304 is also separated from the well bulk contact 306 by isolation oxide 314 and the substrate contact 308 is also separated from the well bulk contact 306 by another oxide layer 316. All the contacts are formed within a substrate 318. Several doped regions are formed or created between the contacts in order to create a transistor that uses the gate, drain, and source contacts. A first doped region 320 extends from under the well bulk contact 306, the source contact 304, and a portion of the gate 312. A second doped region 322 extends under the first doped region 320 from the substrate contact 308 to the drain contact 300. A third doped region 324 is located under the second doped region 322 and extends from the substrate contact 308 at least until the drain contact 300. A fourth doped region 326 is located below the third doped region 324. A fifth doped region 328 is located under the drain contact 300 and may extend under the isolation oxide 310 between the gate and drain. Each of these doped regions may alternate between n-type and p-type dopants in order to operate as an NPN or PNP transistor. The concentration of the dopants will vary based upon the desired operating characteristics of the transistor 240 as determined by a person of ordinary skill in the art of transistor design and device integration.

Figure 4:
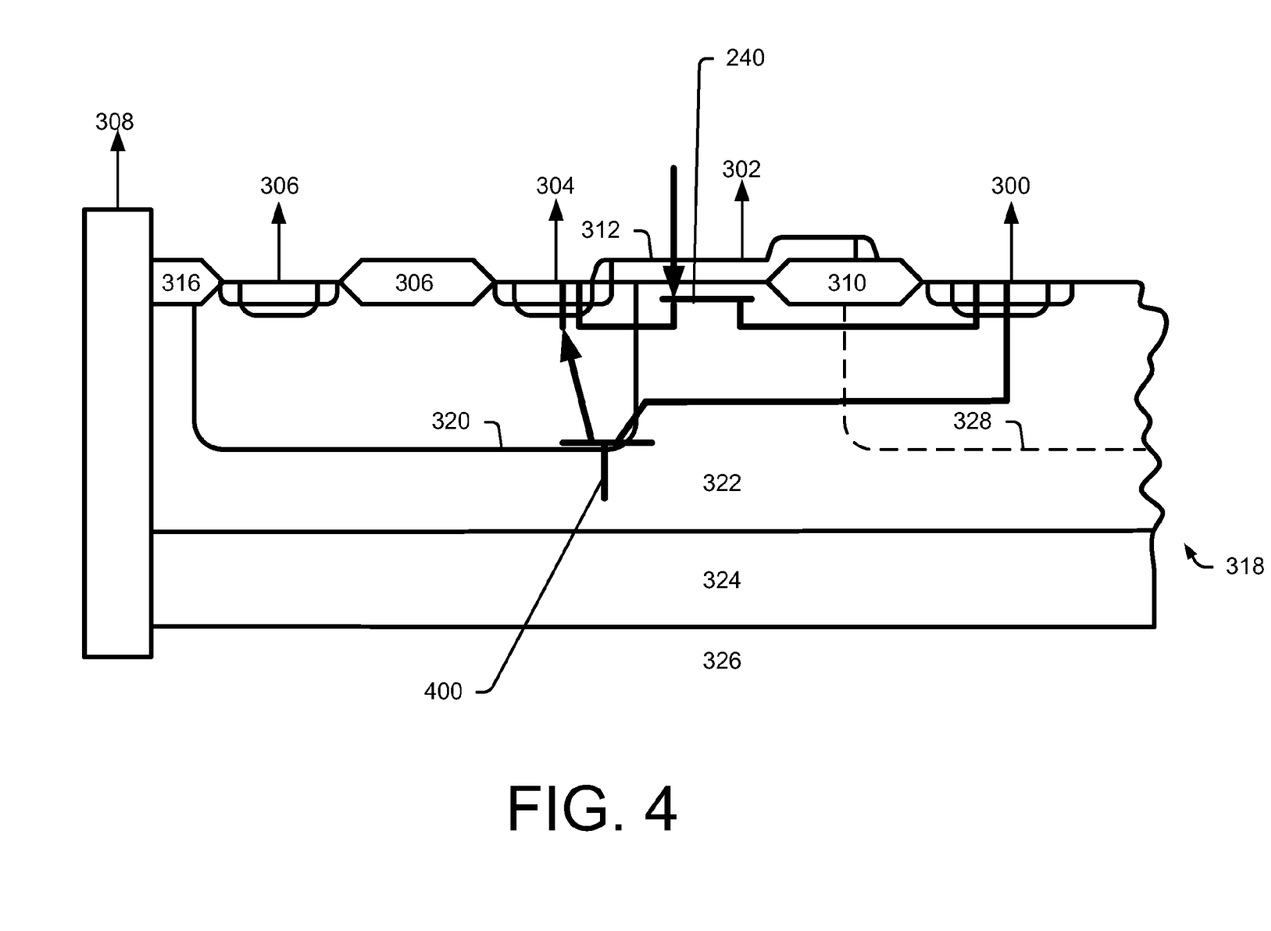
FIG. 4 shows a diagram of another illustrative ESD protection device usable in the circuit of FIG. 2.

FIG. 4 illustrates the transistor 240 within the substrate 318 and includes the circuit representation of transistor 240 overlaid on the substrate 318. In this embodiment, the transistor 240 is a field effect transistor. However, many other transistor types may be used in addition to or in lieu of the field effect transistor. The layout of the transistor 240 from FIG. 3 also creates a second transistor 400 that shares two of the three contacts used by the transistor 240. The circuit representation of the second transistor 400 is overlaid on the substrate 318 in FIG. 4. The circuit representations presented in FIG. 4 are provided for example only in order to clarify how the transistor 240 and the second transistor 400 are related to each other. For example, transistor 240 is the primary operating component and the second transistor 400 is the ESD protection component that directs ESD current away from the gate 312 of transistor 210. Additional details of how the current is directed away from the gate 312 are described below.

Figure 5A:
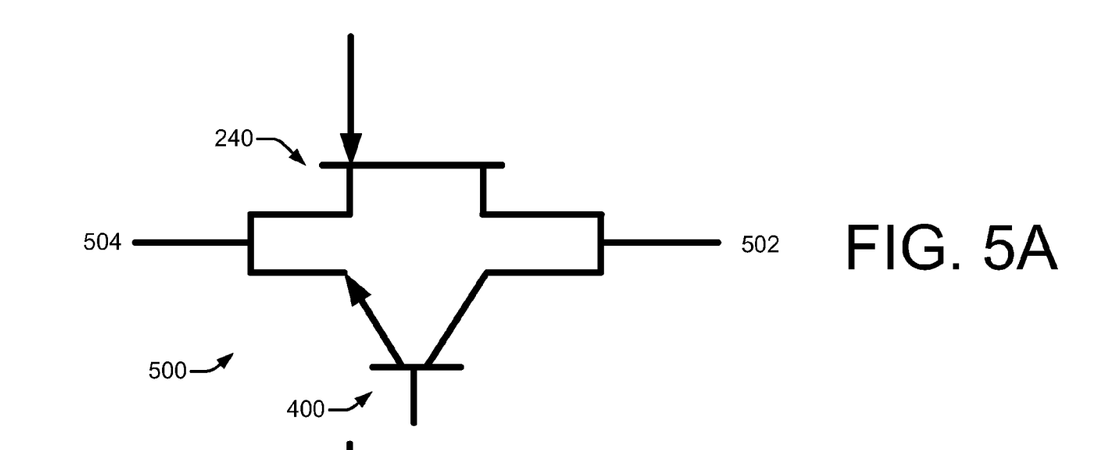
FIG. 5A shows circuit diagrams of another illustrative ESD protection device usable in the circuit of FIG. 3.

FIG. 5A illustrates an ESD protection circuit design 500 that incorporates first transistor 240 and a second transistor 400. The transistors 240, 400 are connected in parallel. In this embodiment, the first transistor 240 is a field effect transistor and the second transistor is a bipolar junction transistor. Hence, the drain of the first transistor 502 and the collector of the second transistor 502 are electrically connected to one another and the source of the first transistor 504 and the emitter of the second transistor 504 are electrically connected to one another.

Figure 5B:
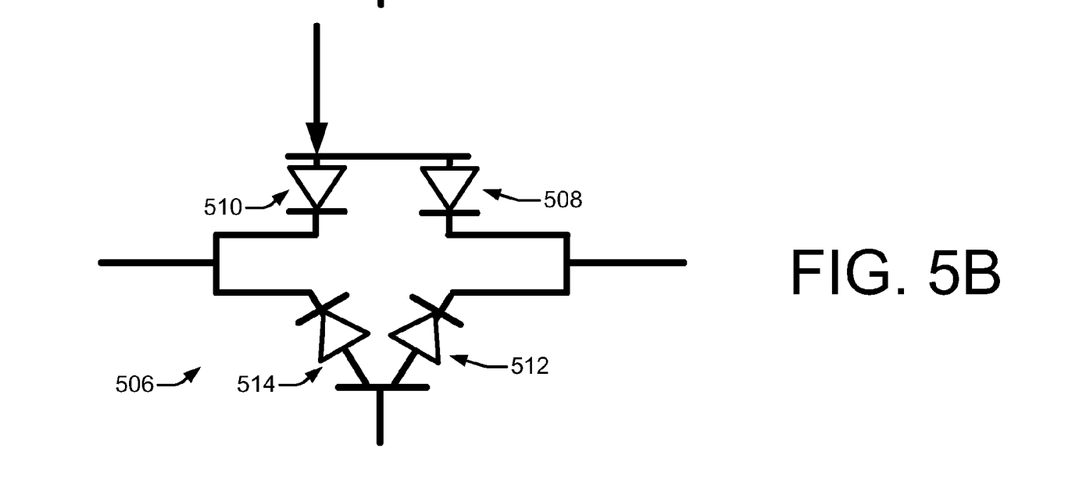
FIG. 5B shows circuit diagrams of another illustrative ESD protection device usable in the circuit of FIG. 3.

FIG. 5B illustrates an ESD protection circuit 506, the first and second transistors are represented by individual diodes that form each transistor. Diodes 508, 510 form the first transistor 240 and diodes 512, 514 form the second transistor 400.

In one embodiment, the first transistor 240 is designed to operate as a functional transistor as part of the output stage 236. The second transistor 400 is intended to act as an ESD protection device for transistor 240. For example, if the drain voltage for transistor 240 should exceed its intended operating voltage, the second transistor 400 is configured to transfer the excessive current away from the gate 312 of the first transistor 240 in order to protect the gate 312 from being damaged by high current flow. The second transistor channels the excessive current from the drain of the first transistor 502 to the source of the first transistor 504 without passing through the gate 312 of the first transistor 240. The current path is from the common drain/collector 502 through the base of the second transistor 400 and then through the common source/emitter 504. This permits the excessive current to bypass the gate of the first transistor 240. If the gate oxide of the first transistor 240 is exposed to excessive current it may damage the gate oxide so that the transistor 240 will be rendered inoperative. The current bypass of the ESD protection circuit, as described above, is achieved by tuning the diode of the first transistor 508 and the diode of the second transistor 512 such that the breakdown voltage of the first transistor diode 508 is lower than the breakdown voltage of the second transistor diode 512. The normal operating voltage of the first transistor 240 is less than the breakdown voltage of the diode of the second transistor 512, which enables the first transistor 240 to operate normally unless the drain voltage exceeds the breakdown voltage for the diode of the second transistor 512.

Figure 6:
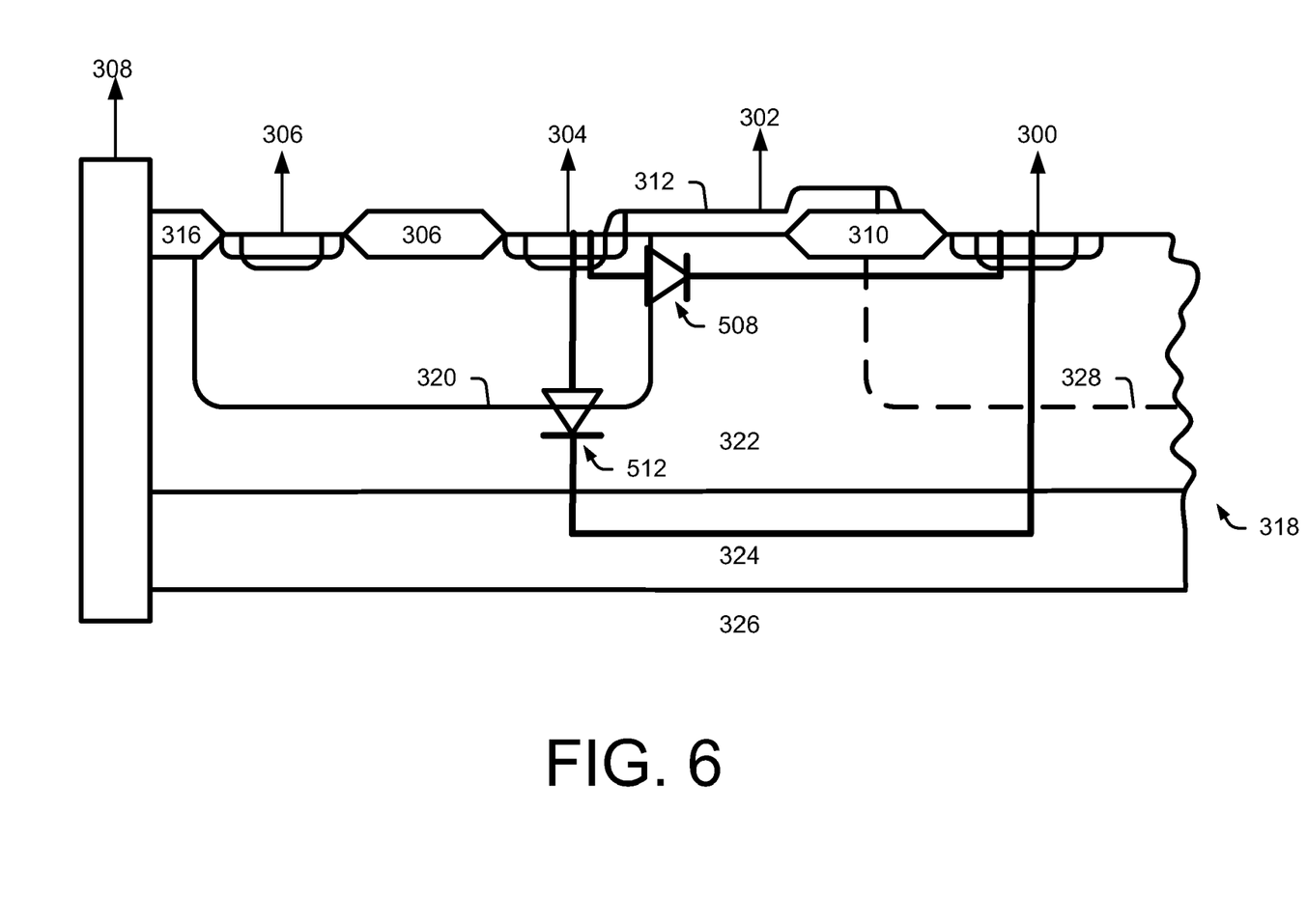
FIG. 6 shows a diagram of another illustrative ESD protection device usable in the circuit of FIG. 2.

FIG. 6 is a diagram of transistor 240 that is overlaid with circuit representations of a diode 508 and a diode 512. The remaining diodes 510 and 514 are excluded from this representation; they still exist but are not shown here for ease of illustration. In this embodiment, the regions that comprise the second diode 512 may be modified or arranged in order to produce a breakdown voltage for the second diode 512 that is less than the breakdown voltage for the first diode 508. Additional embodiments will be discussed in greater detail below.

In this embodiment, the first doped region 320 and the second doped region form the second diode 512. The concentration of the dopants may vary from the regions that form diode 508 such that the breakdown voltage of the second diode 512 is less than the breakdown voltage of the first diode 508. The differences in lateral and vertical diffusion of dopants may be exploited in order to create the differences in breakdown voltage. For example, the dopant concentration of the first doped region 320 may not be uniform across the region such that the diodes 508 and 512 may exhibit different performance characteristics. For example, the first diode 508 may have a breakdown voltage that is higher than the breakdown voltage of the second diode 512.

Figure 7:
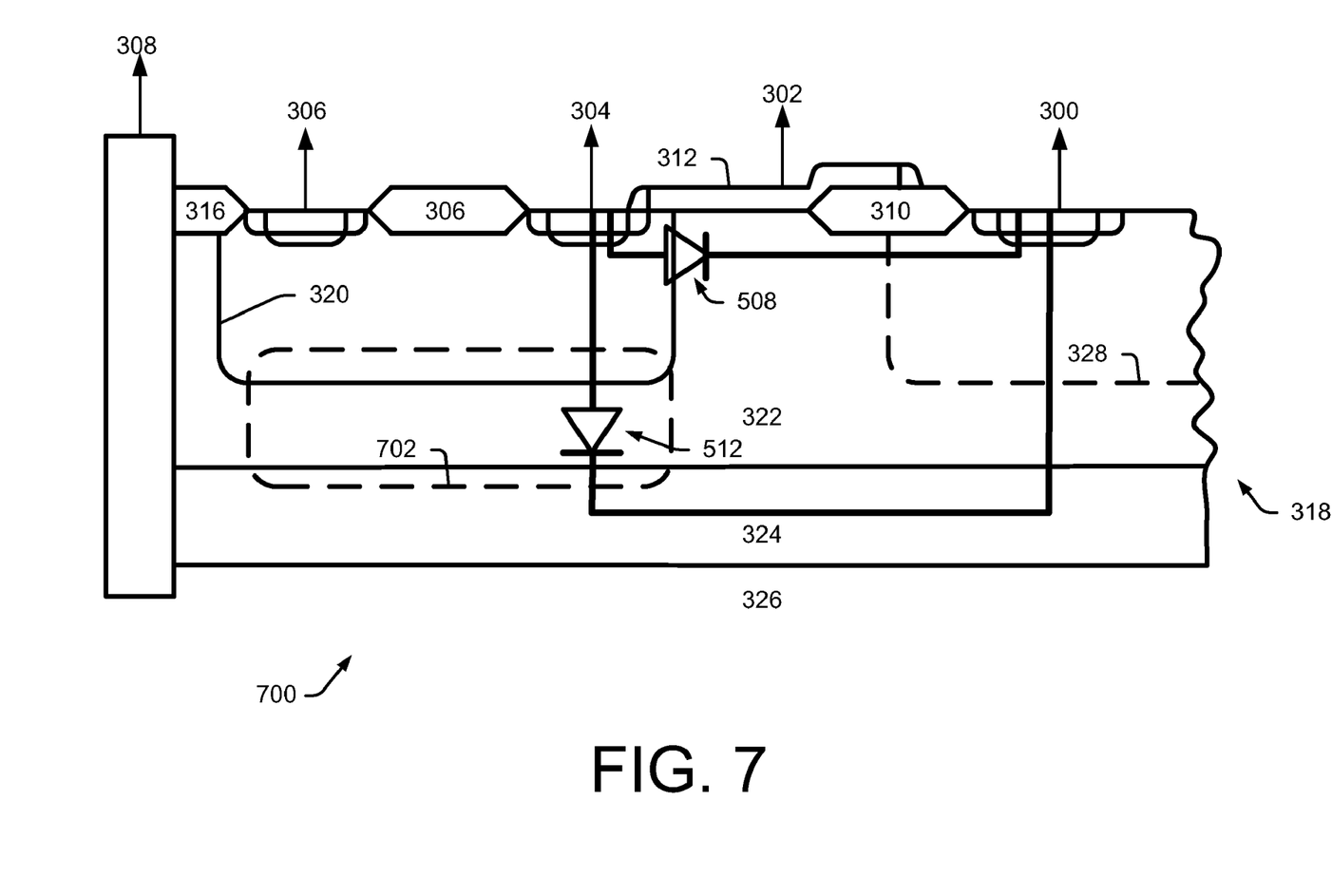
FIG. 7 shows a diagram of another illustrative embodiment of an ESD protection device.

FIG. 7 illustrates another embodiment of the ESD protection device described in FIG. 6. The ESD protection device 700 includes a first diode 508 and second diode 512 in which the breakdown voltage for the second diode 512 is lower than the breakdown voltage for the first diode 508. The ESD protection device 700 includes doped region 702 that overlaps a portion of the first doped region 320, the second doped region 322, and the third doped region 324. In an alternative embodiment, the doped region 702 only overlaps the first doped region 320 and the second doped region 322. In yet another embodiment, the doped region 702 overlaps a portion of the first doped region 302. These embodiments discussed above can be optimized by either position or dopant concentration in order to produce the proper breakdown voltage performance between the first diode 508 and the second diode 512.

Figure 8:
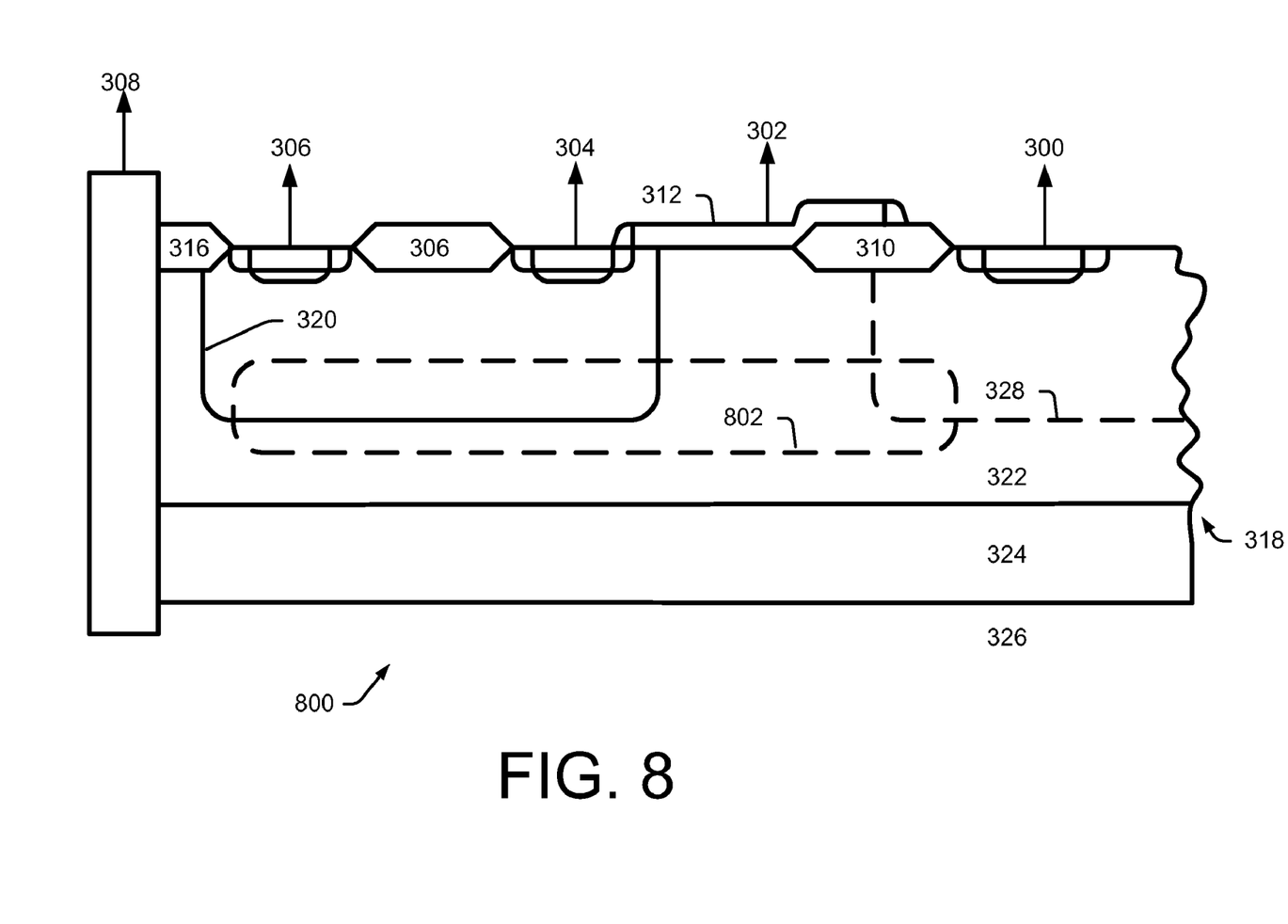
FIG. 8 shows a diagram of another illustrative embodiment of an ESD protection device.

FIG. 8 illustrates another embodiment of the ESD protection device described in FIG. 6. The ESD protection device 800 includes a first diode and second diode in which the breakdown voltage for the second diode is lower than the breakdown voltage for the first diode. The ESD protection device 800 includes doped region 802 that overlaps a portion of the first doped region 320, the second doped region 322, and the third doped region 328. In this embodiment, the current path through the first diode is from the drain contact 300 to the source contact 304. The current path for the second diode is from the drain contact 300 to the substrate contact 308.

Figure 9:
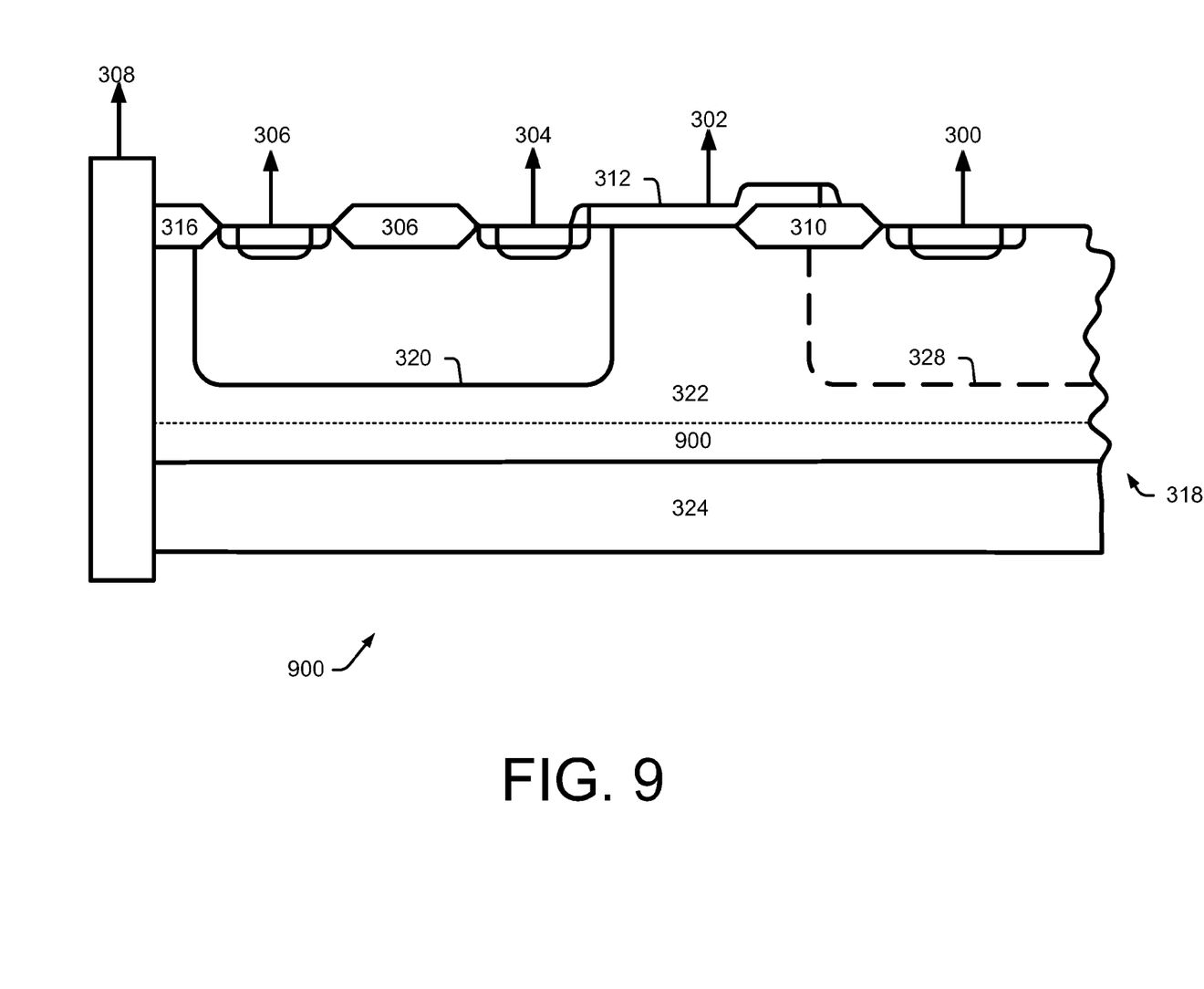
FIG. 9 shows a diagram of another illustrative embodiment of an ESD protection device.

FIG. 9 illustrates another embodiment of the ESD protection device described in FIG. 6. The ESD protection device 900 includes a first diode and second diode in which the breakdown voltage for the second diode is lower than the breakdown voltage for the first diode. The ESD protection device 900 includes doped region 902 located at an interface of the doped region 322 and the another doped region 324. Doped region 900 may be referred to as a pedestal epi layer. In this embodiment, the doped region 900 maybe formed by the diffusion of dopants from doped region 324 up into doped region 322 or by the diffusion of dopants from doped region 322 into doped region 324.

Figure 10:
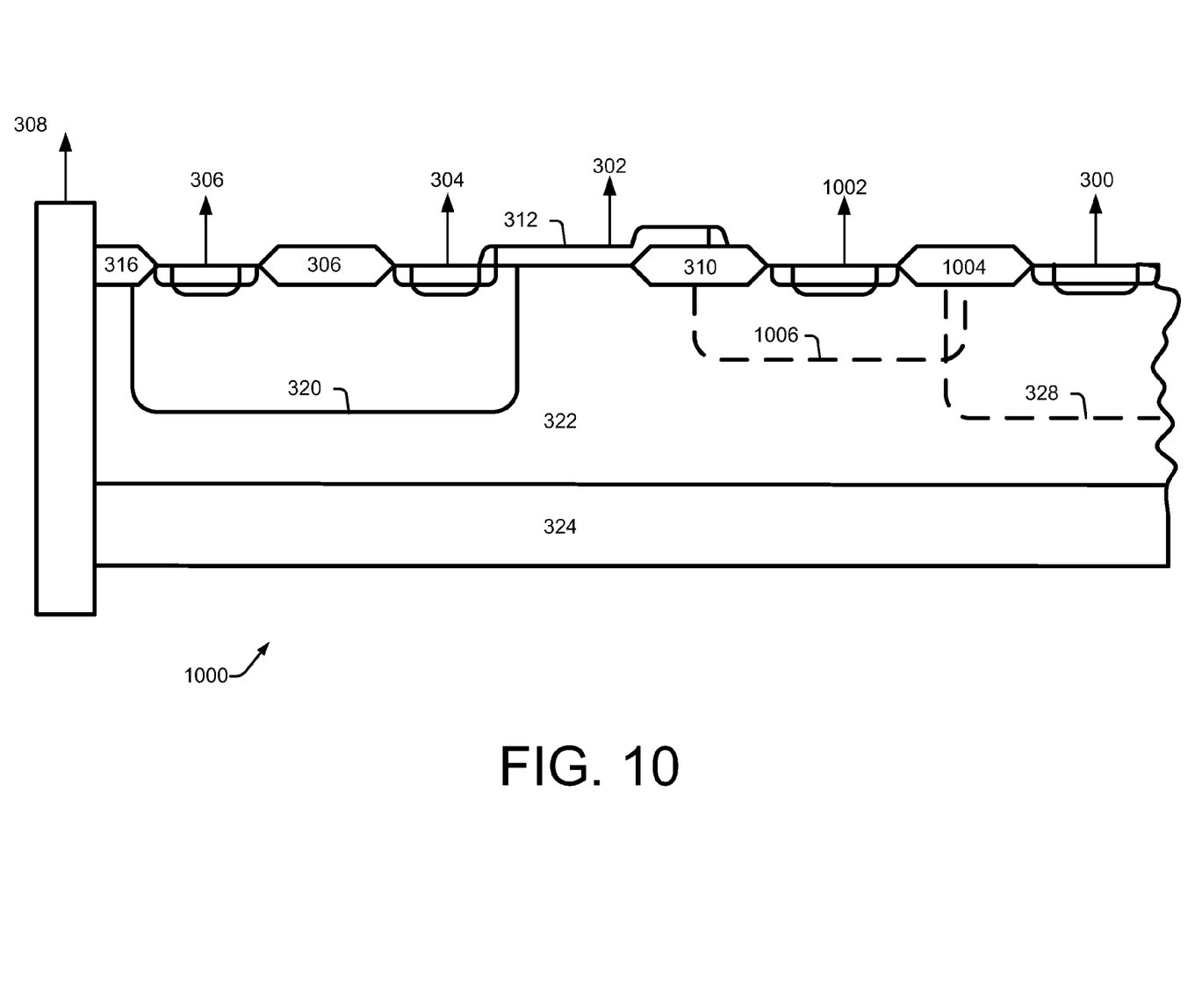
FIG. 10 shows a diagram of another illustrative embodiment of an ESD protection device.

FIG. 10 illustrates another embodiment of an ESD protection device 1000. The ESD protection device 1000 still includes a first diode and second diode in which the breakdown voltage for the second diode is lower than the breakdown voltage for the first diode. However, the ESD protection device 1000 of this embodiment includes a second diode contact 1002 that is placed between the gate 302 and the drain contact 300 and is isolated from each of those contacts by oxide layers 310, 1004. A doped region 1006 associated with the second diode contact overlaps a portion of the doped region 322 and the doped region 328. In an alternative embodiment, doped region 1006 overlaps a portion of doped region 322. The current path for the first diode is from the drain contact 300 to the source contact 304. The current path for the second diode is from the drain contact 300 to the second diode contact 1002.

Figure 11:
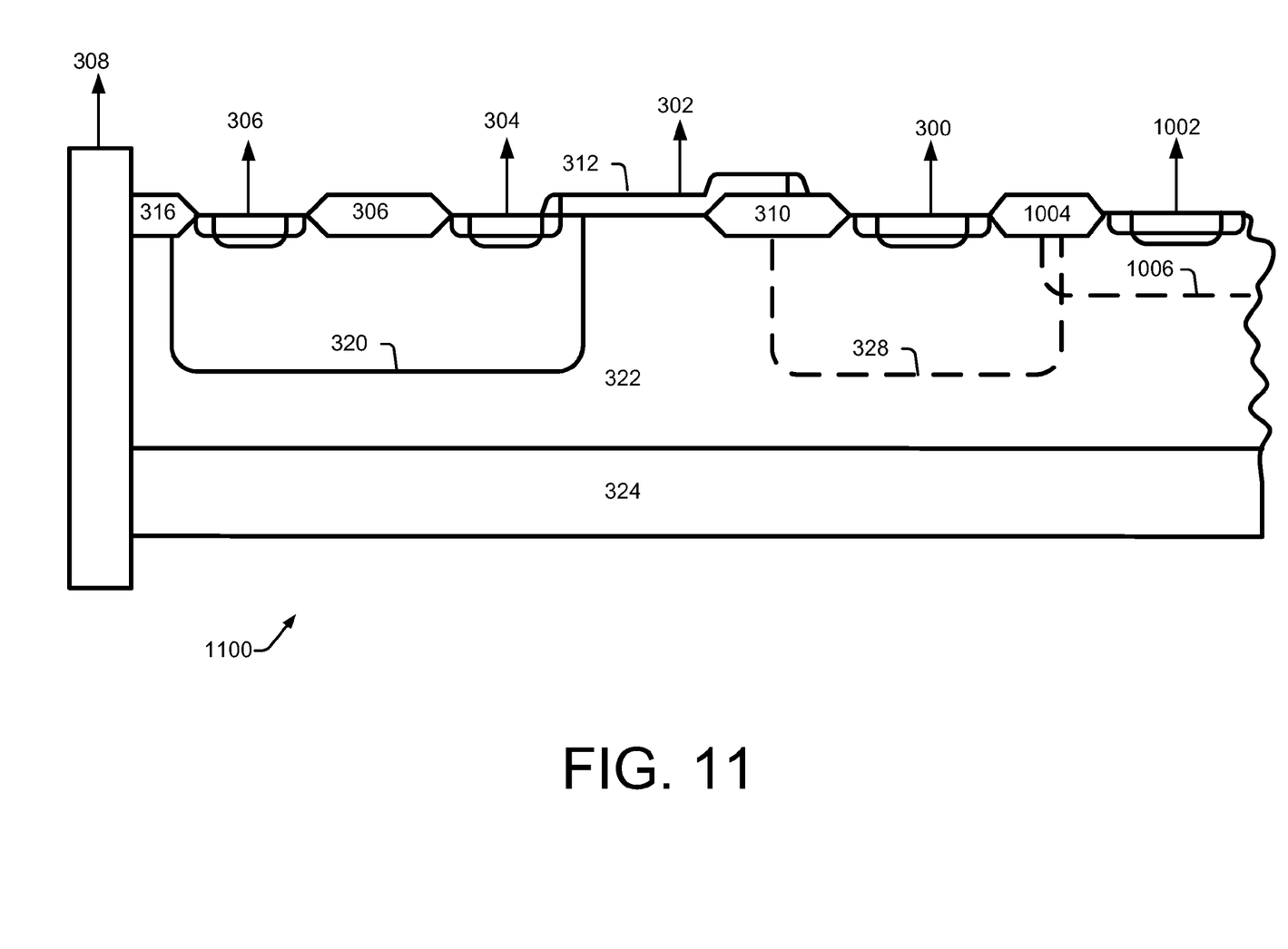
FIG. 11 shows a diagram of yet another illustrative embodiment of an ESD protection device.

FIG. 11 illustrates another embodiment of an ESD protection device 1100. The ESD protection device 1100 still includes a first diode and second diode in which the breakdown voltage for the second diode is lower than the breakdown voltage for the first diode. However, ESD protection device 1100 of this embodiment includes a second diode contact 1002 that is placed adjacent to the drain contact 300 and is isolated from the drain contact by an oxide layer 1004. A doped region 1006 associated with the second diode contact overlaps a portion of the doped region 322 and the doped region 328. In an alternative embodiment, doped region 1006 overlaps a portion of doped region 322. The current path for the first diode is from the drain contact 300 to the source contact 304. The current path for the second diode is from the drain contact 300 to the second diode contact 1002.

Conclusion

Although the embodiments has been described in language specific to structural features and/or methodological acts, it is to be understood that the invention is not necessarily limited to the specific features or acts described. Rather, the specific features and acts are disclosed as illustrative forms of implementing the invention. For example, while embodiments are described having certain shapes, sizes, concentrations, locations, relative locations, and configurations, these shapes, sizes, concentrations, locations, relative locations, and configurations are merely illustrative.

What is claimed is:

1. A circuit comprising:
 a first diode having a breakdown voltage;
 a second diode having a breakdown voltage, the breakdown voltage of the second diode being lower than the breakdown voltage of the first diode, and the second diode being configured to remain in a reversed biased state until the second diode exceeds the breakdown voltage of the second diode; and
 a cathode of the second diode electrically connected to a cathode of the first diode.

2. The circuit of claim 1 further comprising:
 a third diode;
 an anode of the third diode electrically connected to an anode of the first diode;
 a fourth diode;
 an anode of the fourth diode electrically connected to an anode of the second diode; and
 a cathode of the third diode electrically connected to a cathode of the fourth diode.

3. The circuit of claim 2, wherein the first diode comprises an alternating diode that alternates between a forward biased state and a reversed bias state.

4. The circuit of claim 2, wherein the first diode and the third diode form a first transistor and the second and fourth diode form a second transistor.

5. The circuit of claim 4, wherein the first transistor comprises a field effect transistor.

6. The circuit of claim 4, wherein the second transistor comprises a bipolar junction transistor.

7. The circuit of claim 4, wherein the first transistor and the second transistor are formed in a substrate.

8. An electrostatic discharge protection device comprising:
 a substrate;
 a first electrical path of the substrate, the first electrical path having a breakdown voltage; and
 a second electrical path of the substrate, the second electrical path having a breakdown voltage, the breakdown voltage of the second electrical path lower than the breakdown voltage of the first electrical path;
 wherein the second electrical path is configured to restrict current flow unless the breakdown voltage of the second electrical path is exceeded.

9. The electro-static discharge protection device of claim 8 further comprising:
 a first portion of the first electrical path electrically connected to a first portion of the second electrical path.

10. The electro-static discharge protection device of claim 9 further comprising:
 a second portion of the first electrical path electrically connected to a second portion of the second electrical path.

11. The electro-static discharge protection device of claim 8, wherein the first electrical path includes a first transistor and the second electrical path includes a second transistor.

12. The electro-static discharge protection device of claim 9, wherein the first transistor comprises a field effect transistor.

13. The electro-static discharge protection device of claim 9, wherein the first transistor comprises a bipolar junction transistor.

14. A device comprising:
 a first diode formed by a first doped region comprising a first dopant concentration and a second doped region comprising a second dopant concentration adjacent to the first doped region, the first diode having a breakdown voltage; and a second diode formed by the first doped region comprising the first dopant concentration and the second doped region comprising the second dopant concentration adjacent to the first doped region;

the second diode having a breakdown voltage that is lower than the breakdown voltage of the first diode and being configured to restrict current flow unless the breakdown voltage of the second diode is exceeded.

15. The device of claim 14, wherein the second diode includes the breakdown voltage that is lower than the breakdown voltage of the first diode by further including a third doped region comprising a third dopant concentration located adjacent to the second diode.

16. The device of claim 15, wherein the second diode includes the breakdown voltage that is lower than the breakdown voltage of the first diode by further including a fourth doped region comprising a fourth dopant concentration configured to overlap:

a portion of the first doped region comprising the first dopant concentration, a portion of the second doped region comprising the second dopant concentration, and a portion the third doped region comprising the third dopant concentration; or a portion of the first doped comprising the first dopant concentration and a portion of the second doped region comprising the second dopant concentration.

17. The device of claim 15, wherein the second diode includes the breakdown voltage that is lower than the breakdown voltage of the first diode by further including a fourth doped region comprising a fourth dopant concentration configured to overlap a portion of the second doped region comprising the second dopant concentration.

18. The device of claim 15, wherein the second diode includes the breakdown voltage that is lower than the breakdown voltage of the first diode by further including a fourth doped region comprising a fourth dopant concentration located at an interface of the first doped region comprising the first dopant concentration and the third doped region comprising the third dopant concentration.

19. The device of claim 15, wherein the second diode includes the breakdown voltage that is lower than the breakdown voltage of the first diode by further including a fourth doped region comprising a fourth dopant concentration configured to overlap:

a portion of the first doped region comprising the first dopant concentration, a portion of the second doped region comprising the second dopant concentration, and a portion of a fifth doped region comprising a fifth dopant concentration.

20. The device of claim 14, wherein the first diode comprises an alternating diode configured to alternate between a forward biased state and a reversed biased state while the second diode remains in the reversed biased state unless the second breakdown voltage is exceeded.

* * * * *